United States Patent [19]
Sander et al.

[11] 3,949,243
[45] Apr. 6, 1976

[54] BIPOLAR MEMORY CIRCUIT

[75] Inventors: Wendell B. Sander, Cupertino;
Michael P. Anthony, San Carlos,
both of Calif.

[73] Assignee: **Fairchild Camera and Instrument
Corporation,** Mountain View, Calif.

[22] Filed: Feb. 3, 1975

[21] Appl. No.: 546,583

Related U.S. Application Data

[63] Continuation of Ser. No. 407,710, Oct. 18, 1973, Pat. No. 3,898,483.

[52] U.S. Cl. ............... 307/238; 307/300; 340/173 R
[51] Int. Cl.² .......................................... G11C 11/40
[58] Field of Search ......... 307/238, 300; 340/173 R, 340/173 CA

[56] References Cited
UNITED STATES PATENTS

| | | | |
|---|---|---|---|
| 2,991,374 | 7/1961 | DeMiranda et al. ............ | 307/300 X |
| 3,299,290 | 1/1967 | Moll ................................. | 307/300 X |
| 3,588,544 | 6/1971 | Wallingford .................... | 307/300 X |
| 3,696,285 | 10/1972 | Saia ................................ | 307/300 X |

*Primary Examiner*—John Zazworsky
*Attorney, Agent, or Firm*—Alan H. MacPherson; Henry K. Woodward; J. Ronald Richbourg

[57] ABSTRACT

A bipolar memory circuit having a storage cell including a single bipolar transistor whose collector-base junction acts to provide a capacitor for capacitive charge storage; a charging means coupled to the emitter or collector to charge the collector-base capacitor of the transistor, the charged condition of that capacitor indicating a first memory state; a discharging means including at least one PN junction series coupled with the base-collector junction of the transistor, the discharging means including an input means coupled through the PN junction for discharging the charge stored in the collector-base junction without need for avalanching the transistor, the discharged condition of the capacitor being indicative of the opposite state of the memory storage cell; a pulse supply for applying sensing pulses between the emitter and the collector electrodes of the transistor; and a signal-detecting circuit at one of the collector or emitter electrodes of the transistor for determining what state the memory cell is in at the time a sensing pulse is applied.

4 Claims, 6 Drawing Figures

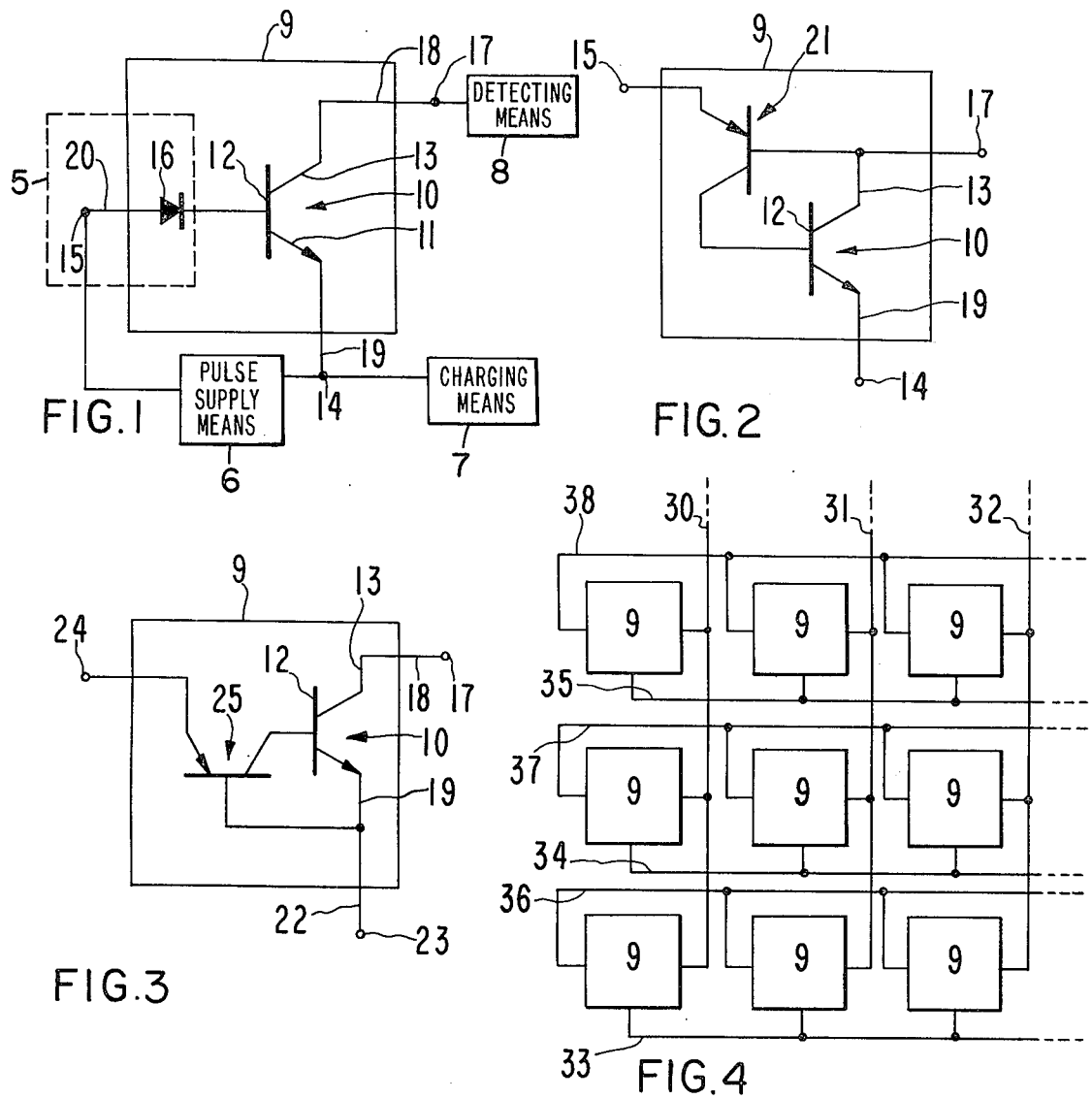
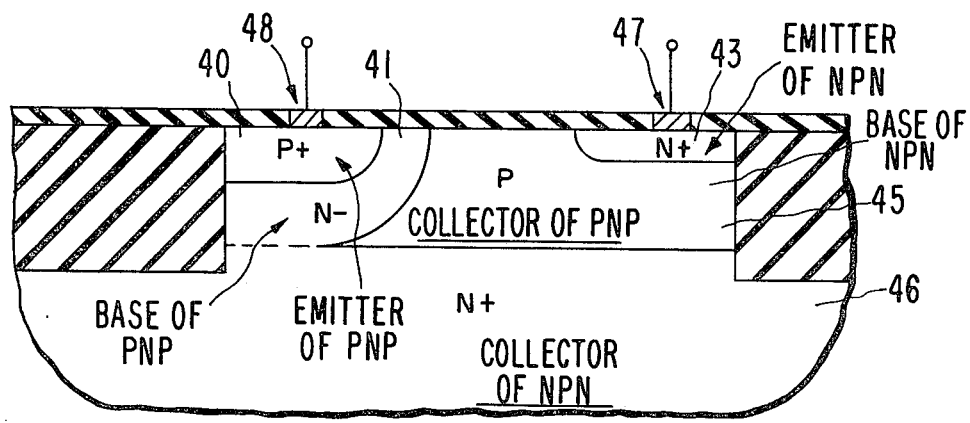

BIPOLAR MEMORY CIRCUIT

This is a continuation of application Ser. No. 407,710 filed Oct. 18, 1973, now U.S. Pat. No. 3,898,483.

BACKGROUND OF THE INVENTION

1. Field of the Invention

This invention is in the field of semiconductor memory cells, and in particular, an improved memory cell which uses only a single transistor for storage.

2. Prior Art

Single transistor memory cells, sometimes called "two-terminal" transistor memory cells are well known in the art. For example, in the IEEE Journal of Solid-State Circuits, Vol. SC-6, No. 5, October, 1971, pp. 280–283, a description of one such cell appears. This cell uses a single transistor and stores charge on the reverse-biased, back-to-back PN junctions. In operation of this cell, to obtain "charge erasure" (the state in which the capacitors become discharged), at least one PN junction of the transistor must be operated in the avalanche breakdown mode. While using avalanche breakdown to erase the charge is a convenient technique which enables the cell to be built using only a single transistor, it also has certain disadvantages. Lifetime studies have shown that continual avalanching of the junctions causes damage to the junctions and impairs the life of the memory device. Transistor degradation due to repeated breakdown of PN junctions is a well known phenomenon (see D. R. Collins "$h_{FE}$ Degradation Due to Reverse-Bias Emitter-Base Junction Stress," IEEE Transactions on Electron Devices, Vol. ED-16, April, 1969, pp. 403–406 ). In order to avoid this problem, special types of transistors have been employed in the past. However, such transistors are more difficult to make and have not been capable of reliable large-scale production of large memory arrays.

BRIEF SUMMARY OF THE INVENTION

The present invention provides a new type of memory cell which is capable of being written into and read out of without avalanching either of the PN junctions of the storage transistor. Briefly, the memory circuit of this invention includes: a storage cell including a single bipolar transistor having emitter, base and collector electrodes; a collector-base junction between the base and collector which acts to provide a capacitor for capacitive charge storage; a charging means coupled to the emitter or collector electrode of the transistor for charging the collector-base junction capacitance through the emitter-base diode, the charged condition of the transistor being indicative of a first state of the memory storage cell; a discharging means including at least one PN junction in series with the base-collector junction of the transistor and an input means coupled to the PN junction for discharging the charge stored in the collector-base junction of the single bipolar transistor without need for avalanching the transistor, the discharged condition of the capacitor being indicative of a second state of the memory storage cell; a pulse supply for transmitting sensing pulses of predetermined magnitude and polarity between the emitter and collector electrodes of the single bipolar transistor; and a detecting means for detecting the signal at one of the emitter and collector electrodes of the single bipolar transistor simultaneously with the receipt of a sensing pulse for determining what memory state the cell is in.

The PN junction in the discharging means of the invention can take the form of either a diode or a part of a transistor of the opposite polarity type from the storage transistor. For example, if the storage cell transistor is an NPN transistor, the other transistor of the opposite polarity type having the necessary PN junction is a PNP transistor.

DETAILED DESCRIPTION

FIG. 1 is a schematic circuit diagram of one embodiment of the invention;

FIG. 2 is a schematic diagram of another embodiment of the invention;

FIG. 3 is a schematic diagram of still another embodiment of the invention;

FIGS. 4 and 5 are block and schematic diagrams of an array of cells of the type shown in FIGS. 1 or 2, and in FIG. 3, respectively; and FIG. 6 is a cross-sectional view of the structure of a complementary transistor pair which can be used in the memory circuit of FIG. 2.

Figure 5:
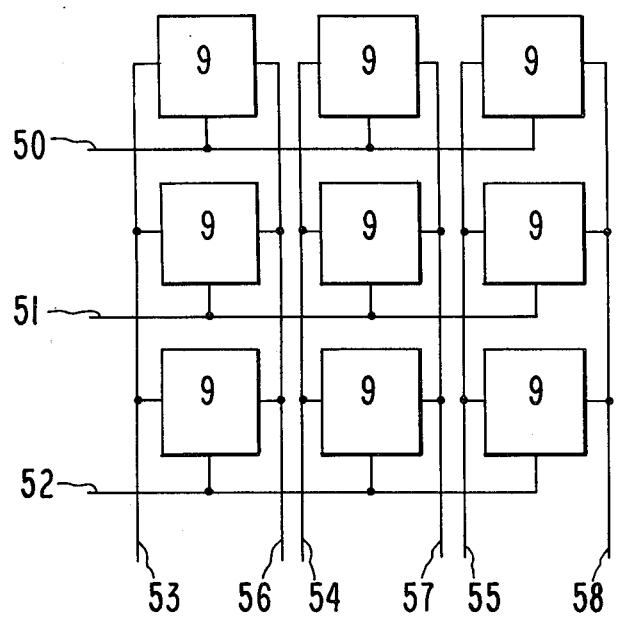

Referring now to FIG. 1, a memory cell 9 of one embodiment of the invention is shown. The storage cell consists of the single bipolar transistor 10 having an emitter 11, a base 12, and a collector 13. In the embodiment shown, the single transistor is a NPN transistor. The PN junction between collector 13 and base 12 acts to provide a capacitor for capacitive charge storage. Terminal 14 is coupled to the emitter 11 of transistor 10 and serves as the terminal for charging means 7. A negative-going pulse into terminal 14 is used in this embodiment of the invention to charge the capacitance of the collector-base junction. The resulting charge condition is indicative of a first state of the memory cell 9 as will be explained in more detail in a later section describing the operation of the cell. The exact amount of charge is not critical as long as it is sufficient so that the difference between the charged and discharged state of the capacitor may be readily electrically detected.

Cell 9 includes a discharging means 5 including terminal 15 and diode 16. The PN junction of diode 16 is connected in series with the base-collector junction of transistor 10. Terminal 15 acts as an input terminal for coupling positive pulses from pulse means 6 through the PN junction of diode 16 for turning on transistor 10, causing a lowering of the voltage at collector electrode 13, and simultaneously discharging any charge stored in the collector-base junction of transistor 10 through the PN junction of diode 16. This discharge is accomplished without the need of avalanching either of the two PN junctions of transistor 10 or PN junction 16.

Terminal 14 serves an additional function in connection with readout of the cell. A sensing pulse of a predetermined magnitude and polarity from pulse means 6 is applied to terminal 14 and thus to the emitter electrode 11 of transistor 10. In this embodiment, the pulse polarity is negative. The state of the memory cell is determined through a detecting means 8 connected to terminal 17. At the same time as a sensing pulse is applied to terminal 14, the signal at terminal 17 coupled to collector electrode 13 of transistor 10 is detected to ascertain what state memory cell 9 was in at the onset of the read operation.

In conventional memory cell parlance, line 18 is called the "bit line" of the cell; lines 19 and 20 are called the "word lines" of the cell. The cell 9 of this invention has two separate word lines 19 and 20. However, in certain modes of operation of the cell, as will be described later, they may be connected into a single word line.

Referring to FIG. 2, a cell of another embodiment of the invention is shown. This cell operates in a similar manner to the cell of FIG. 1, described above. However, in addition to the storage transistor 10, the cell has a second bipolar transistor 21 of the opposite polarity type from the single bipolar transistor 10. In the example shown, transistor 10 is NPN and transistor 21 is PNP. Terminals 14, 15, and 17 operate in the same manner as the corresponding terminals in the embodiment of FIG. 1. In the embodiment of FIG. 2, the PN junction of the discharging means is the emitter-base junction of PNP transistor 21. The input signal through terminal 15 is coupled through this emitter-base junction of transistor 21 to turn on the transistor 21 and thus to discharge the charge stored in the collector-base junction of the storage transistor 10 without need for avalanching the transistor.

FIG. 3 shows a third embodiment of the invention. Transistor 10 serves the same function as in the previous embodiments. In this embodiment, line 18 is the bit line and terminal 17 is the output terminal for detecting the signal at the collector electrode of transistor 10 to determine what state the cell 9 is in. In the embodiment of FIG. 3, however, there is only a single word line 22. The charging means coupled to the emitter of transistor 10 is terminal 23. Terminal 24 is coupled to a second bit line rather than to a second word line as in the previous embodiments. In this embodiment, the discharging means is PNP transistor 25 in series with the collector-base junction of storage transistor 10. The input means 24 is coupled to the base of transistor 10 through both junctions of transistor 25 for turning on transistors 10 and 25, lowering the voltage at collector 13 of transistor 10, and thus discharging the charge stored in the collector-base junction of transistor 10 without need for avalanche. Detecting the state of the cell 9 is accomplished in the same manner as before, through terminal 17.

FIG. 4 shows an array of cells 9 if cells of the embodiments of FIGS. 1 and 2 are employed. Lines 30, 31 and 32 are bit lines of the array. Lines 33, 34 and 35, and lines 36, 37 and 38 are two sets of word lines.

FIG. 5 shows an array of cells of the type shown in FIG. 3. Lines 50, 51, and 52 are word lines connecting the terminals 23 in FIG. 3. Lines 53, 54 and 55 are bit lines connecting the terminals 24 in FIG. 3; lines 56, 57, and 58 are the second bit lines connecting the terminals 17 in FIG. 3.

There are two principal aspects to the operation of any one of the cells of the invention; writing data into the cell and reading data out of the cell. For reading, it is necessary to apply a voltage between terminals 14 and 17 of the cells of FIGS. 1 or 2, or between terminals 23 and 17 in the cell of FIG. 3. This voltage should be positive on collector electrode 13 and negative on emitter electrode 19, and of such magnitude that if the collector-base capacitor is charged, then the emitter-base diode of transistor 10 is only slightly forward biased and conduction through transistor 10 will be slight or non-existent; but if the collector-base capacitor is discharged, then the emitter-base junction is heavily forward biased and measurably higher conduction through transistor 10 will occur. Accordingly, it is only necessary to apply the proper voltage to these terminals 14 (terminal 23 in FIG. 3) and 17 and at the same time measure the signal (either the current or the voltage) at either the emitter terminal 14 (terminal 23 in FIG. 3) or the collector terminal 17. If the capacitor is discharged, the voltage will be lower at terminal 17 and the current flow will be augmented. If the capacitor is charged, the voltage at terminal 17 will be higher and the current will not be augmented.

For writing a 1 binary entry into any of the cells shown in FIGS. 1, 2, or 3 (arbitrarily, a binary 1 is here chosen to be the state where the collector-base capacitor of storage transistor 10 is charged) a three volt pulse is applied between terminals 17 and 14 (or terminal 23 in FIG. 3) with the positive side of the pulse at terminal 17. In this situation, charge will be stored in the collector-base junction of storage transistor 10.

For writing a binary 0 into cell 9 in the embodiment of FIG. 1, (a binary 0 arbitrarily is the state where the collector-base capacitor of storage transistor 10 is discharged), a sufficiently positive voltage is applied to word line terminal 15 while holding bit line terminal 17 at a more negative potential than is used for writing a binary 1. If the collector-base junction of storage transistor 10 had then been charged, it will become discharged; and if it were not charged, the application of these pulses will have no effect.

For the cell 9 of FIG. 2, for writing a binary 0, a positive voltage is applied between word line 15 and bit line 17, the positive side being on line 15, while holding word line 14 more positive than bit line 17. This causes transistor 21 to turn on, discharging the collector-base capacitor of transistor 10.

For the cell 9 in FIG. 3, writing a 0 is accomplished by applying a positive voltage pulse on terminal 24 with respect to terminal 23 in order to turn on both PNP transistor 24 and storage transistor 10. When PNP transistor 25 is turned on, any charge stored in the collector-base junction of storage transistor 10 will be discharged.

If it is desired to have a common word line rather than two separate word lines in the embodiments of FIGS. 1 and 2, terminals 14 and 15 may be made common. The use of two word lines rather than a single word line provides additional signal during reading. If careful cell design techniques are employed, however, a single word line may be substituted for the two word lines, thus eliminating additional wiring between cells of the array.

In order for circuits of the type generally used in this invention to operate, the base region 12 of storage transistor 10 must float while the cell is in the quiescent state (not being read out of or written into). In the prior art circuits, the base of the storage transistor was therefore unconnected. Accordingly, avalanche was required to write a binary 0 into such a cell. In this invention, the necessity of avalanche is eliminated by the use of an additional PN junction in series with the base region of storage transistor 10 (either a diode or a transistor of the opposite polarity type). Accordingly, the cells of this invention have longer lives. Furthermore, eliminating the need for avalanching the transistor simplifies the external circuitry customarily required for reading and writing and reduces the maximum required magnitude of the supply voltage.

Although at first appearance, it may seem that the memory cell of the subject invention is more complicated to fabricate than the single transistor cell of the prior art, complementary transistor pairs of the type shown in FIG. 2, for example, may be readily fabricated using advanced but now established integrated circuit fabrication techniques. Referring to FIG. 6, a cross-section is shown of a complementary transistor pair as required in the embodiment of the invention shown in FIG. 2. The PNP transistor 21 in FIG. 2 is found in FIG. 6 to include emitter region 40, base region 41 and collector region 45. The NPN transistor 10 in FIG. 2 is found in FIG. 6 to include emitter region 43, base region 45 and collector region 46. Note that the N-type base region 41 of the PNP transistor is common with the collector region 46 of the NPN transistor. Similarly, the P-type collector region 45 of the PNP transistor is common with the P-type base region 45 of the NPN transistor. FIG. 2 shows the common connection of the N-type base region of PNP transistor 21 and the P-type base region 12 of NPN transistor 10.

Two of the three electrical contacts of the cell of FIG. 2, namely terminals 14 and 15, are found respectively in the structure of FIG. 6 as contact terminals 47 and 48. No further contacts to each cell of the type shown in FIG. 6 are required to connect the cells into arrays in the manner shown in FIG. 4 because terminals 17 in FIG. 2, the NPN collector terminals, are internally interconnected within the cells of FIG. 6 by common N+ region 46. Standard integrated metal surface circuit interconnection techniques, such as those disclosed in U.S. Pat. No. 2,981,877 assigned to the same assignee as this invention, may be employed.

The fabrication techniques of the complementary transistor structure shown in FIG. 6 are now known in the art. They are disclosed in detail in U.S. Pat. application Ser. No. 357,968, of Richard D. Schinella and Michael P. Anthony, filed May 7, 1973 and assigned to the same assignee as this invention. The same or similar integrated circuit fabrication techniques may be employed in the construction of the cells shown in FIGS. 1 and 3.

We claim:
1. A memory circuit comprising:
   a. a storage cell including a single bipolar transistor having emitter, base and collector electrodes;
   b. a collector-base junction between said base and said collector which acts to provide a capacitor for capacitive charge storage;
   c. a first terminal means for coupling a charging means to one of the emitter and collector electrodes of said transistor for charging said collector-base capacitor, the charged condition of said capacitor being indicative of a first state of said memory storage cell;
   d. a second terminal means for coupling a pulse supply means to said transistor for applying a sensing pulse of a predetermined magnitude and polarity of one of said emitter and collector electrodes of said single bipolar transistor; said second terminal means comprising a first word line for addressing said cell;
   e. a discharging means including at least one PN junction in series with the base-collector junction of said transistor and with said second terminal means for discharging the charge stored in said collector-base junction without need for avalanching said transistor, the discharged condition of said capacitor being indicative of a second state of said memory storage cell; said discharge means comprising a second word line for addressing said cell; and
   f. a third terminal means comprising a bit line for coupling a detecting means to said transistor for detecting the degree of forward bias on the emitter-base junction through one of said collector and emitter electrodes simultaneously with the application of sensing pulse, for determining what state the cell is in.

2. The memory circuit of claim 1 further characterized by said PN junction being a diode having one of its terminals coupled to the base electrode of said single transistor.

3. The memory circuit of claim 2 further characterized by said single transistor being an NPN transistor and the terminal of said diode which is coupled to said base electrode of said transistor being the cathode of said diode.

4. The memory circuit of claim 2 further characterized by said input means of said discharging means being coupled to the other terminal of said diode.

* * * * *